(12) United States Patent
Good

(10) Patent No.: US 8,838,200 B2
(45) Date of Patent: Sep. 16, 2014

(54) MAGNETIC RESONANCE IMAGING APPARATUS AND METHOD USING SQUID DETECTION AND FIELD-CYCLING

(76) Inventor: Jeremy A. Good, The Vale (GB)

( * ) Notice: Subject to any disclaimer, the term of this patent is extended or adjusted under 35 U.S.C. 154(b) by 0 days.

(21) Appl. No.: 12/996,304

(22) PCT Filed: Jun. 4, 2009

(86) PCT No.: PCT/GB2009/001390
§ 371 (c)(1),
(2), (4) Date: Mar. 14, 2011

(87) PCT Pub. No.: WO2009/147392
PCT Pub. Date: Dec. 10, 2009

(65) Prior Publication Data
US 2011/0190619 A1  Aug. 4, 2011

(30) Foreign Application Priority Data
Jun. 5, 2008  (GB) .................................. 0810322.8

(51) Int. Cl.
*A61B 5/05*  (2006.01)
(52) U.S. Cl.
USPC .......................................... 600/409; 600/411
(58) Field of Classification Search
USPC ......................... 600/407, 409–411
See application file for complete search history.

(56) References Cited

U.S. PATENT DOCUMENTS 4,354,499 A * 10/1982 Damadian ...................... 600/410
2005/0134262 A1   6/2005 Clarke et al.

OTHER PUBLICATIONS

McDermott et al., Microtesla MRI with a Superconducting quantum interfering device. PNAS. 2004; 101(21):7857-7861.*
Gilbert KM, Handler WB, Scholl JT, Odegaard JW, and Chronik BA. Design of field-cycled magnetic resonance systems for small animal imaging. Phys. Med. Biol. 51: 2825-2841. 2006.*
Seton HC, Rieger S, Hutchison J. Tuned SQUID-MRI System with Resonant Frequency Adjustment. IEEE Trans. on Applied Superconductivity, 17(2): 850-853. Jun. 2007.*
Venkatesh et al. MRI of the lung gas-space at very low-field using hyperpolarized noble gases. Magnetic Resonance Imaging 21 (2003) 773-776.*

(Continued)

*Primary Examiner* — Jonathan Cwern
*Assistant Examiner* — Amelie R Gillman
(74) *Attorney, Agent, or Firm* — Edward J. Baba; Bozicevic, Field & Francis LLP

(57) ABSTRACT

There is described an MRI system in which the detection of the NMR signal is performed by a resonant input at a median field range above 100 gauss and where the main field is cycled to a low field of below 50% of the resonant frequency after the excitation of the NMR signal for a period sufficient to develop differences in magnetisation (T1). The advantage of this system is that images can be generated at much lower field intensities than prior art systems and is able to detect abnormalities in tissue such as cancerous tissues in a patient.

16 Claims, 7 Drawing Sheets

(56) References Cited

OTHER PUBLICATIONS

Modica A, Lurie D, and Alecci M. Sequential, co-registered fluorine and proton field-cycled Overhauser imaging at a detection field of 59 mT. Phys. Med. Biol. 51 (2006) N39-N45.*

Carlson, et al. (1992) "MR Relaxometry Imaging. Work in Progress" Radiology, 184(3):635-639.

Fischer, et al. (1990) "Nuclear Relaxation of Human Brain Gray and White Matter: Analysis Offield Dependence and Implications for MRI" Magnetic Resonance in Medicine, 16(2):317-334.

Lee, et al. (2005) "SQUID-Detected MRI at 132 [mu]T with T1-Weighted Contrast Established at 10 [mu]T-300 mT" Magnetic Resonance in Medicine, 53(1):9-14.

Myers, et al. (2005) "Correction of Concomitant Gradient Artifacts in Experimental Microtesla MRI" Journal of Magnetic Resonance, 177(2):274-284.

Planinsic, et al. (1994) "Relaxation-Time Measurement and Imaging in the Earth's Magnetic Field" Journal of Magnetic Resonance, 110(2):170-174.

Seton, et al. (1997) "A 4.2 K Receiver Coil and SQUID Amplifier Used to Improve the SNR of Low-Field Magnetic Resonance Images of the Human Arm" Measurement Science and Technology, 8(2):198-207.

Ungersma, et al. (2006) "Magnetic Resonance Imaging with T1 Dispersion Contrast" Magnetic Resonance in Medicine, 55(6):1362-1371.

Busch et al., "Measurments of T1—relaxation in ex vivo prostate tissue at 132 Ut," Proc. Intl. Soc. Mag. Reson. Med., 16: 2812 (2008).

EOM et al., "Characterization of MRI properties of human body tissues at microTesla magnetic fields," Proc. Intl. Soc. Mag. Reson. Med., 16: 1151 (2008).

Moessle et al., "Microtesla MRI detected with a superconducting quantum interference device," Proc. Intl. Soc. Mag. Reson. Med., 13: 410 (2005).

* cited by examiner

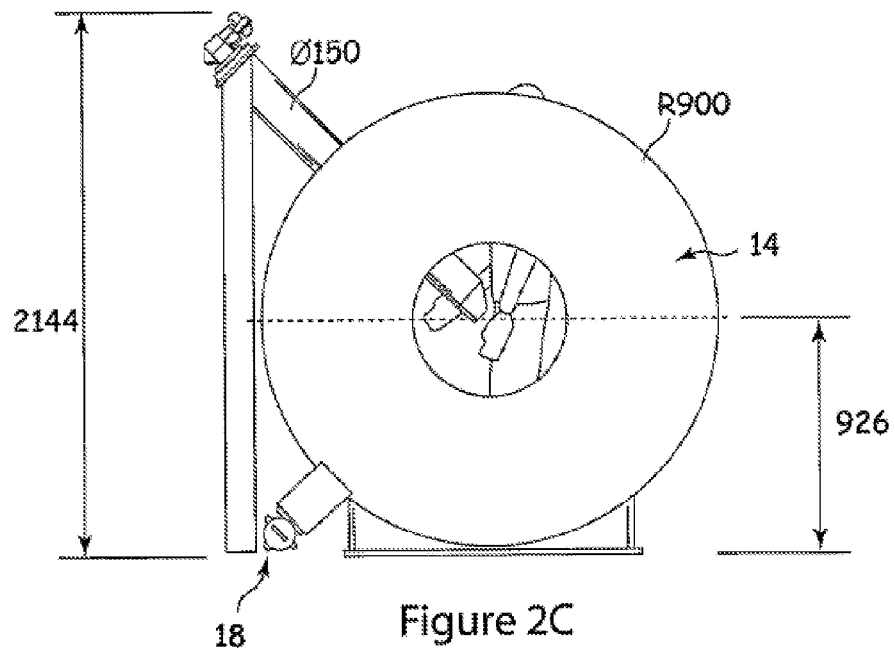
Figure 2C
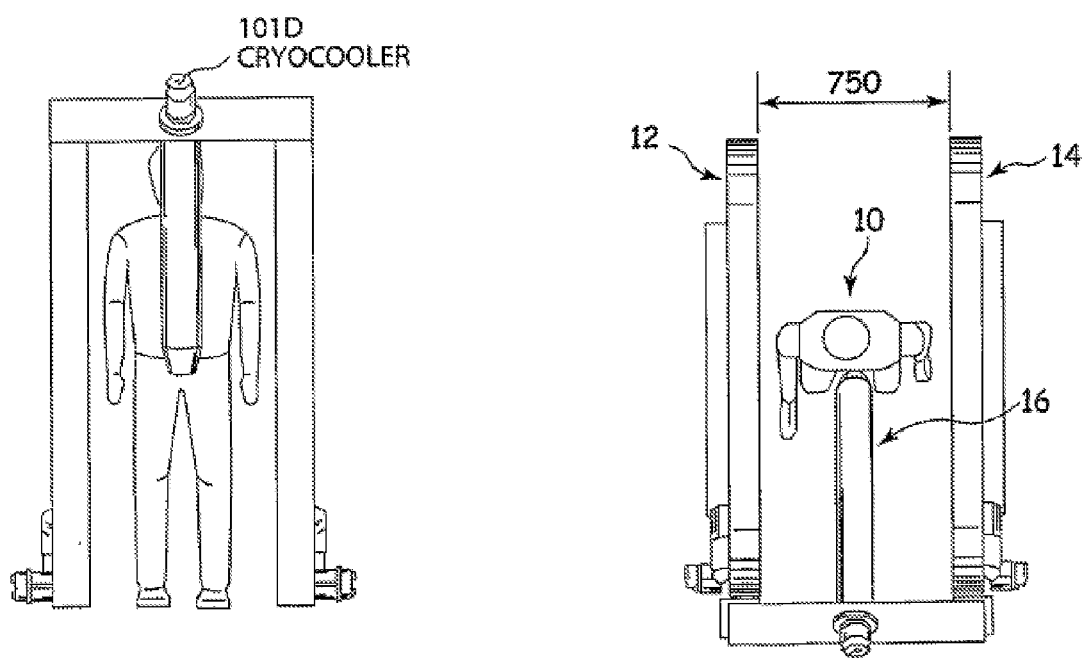
Figure 2D
Figure 2E

MAGNETIC RESONANCE IMAGING APPARATUS AND METHOD USING SQUID DETECTION AND FIELD-CYCLING

FIELD OF THE INVENTION

The present invention relates to magnetic resonance imaging apparatus and methods.

BACKGROUND OF THE INVENTION

Magnetic Resonance Imaging for medical and diagnostic applications is normally carried out at magnetic fields of at least 1 Tesla (10,000 gauss), which corresponds to an RF frequency of 42 MHz for the nuclear magnetic resonance (NMR) signal of protons in water which is the major constituent of the body. The high field results in both better polarisation of the hydrogen nuclei and a strong signal at the higher detection frequency. This results in good contrast and spatial resolution. Whole body imaging at this field requires a large solenoid magnet, usually superconducting with high homogeneity typically a few parts per million over a 40 cm sphere. The patient/subject is placed on a bed which slides into the bore of the magnet. This can be a claustrophobic and unnerving experience. It is made worse due to the noisy operation of the gradient coils as images are acquired over a period of typically 15 minutes. As a result, as many as 20-40% of patients decline the procedure.

Alternative methods use so-called open geometry electromagnets operating at lower fields, typically 2,000-3,000 gauss. The reduction in field and operating frequency gives lower strength and noisier NMR signals for the detection system to acquire, with a consequent loss of image quality.

The limit in using lower fields is set by the ability of the electronic amplifiers and the resonant detection circuits to detect the signals with an adequate signal to noise ratio.

Another approach to detecting the NMR signals for MRI at low fields, developed in recent years but not yet used in practical systems, is to use a Superconducting Quantum Interference Device known as a SQUID. SQUIDs usually operate at very low fields, 1-200 gauss being typical, and have the twin advantages of very low inherent device noise and superconducting input circuits which have, under the right conditions, no Johnson or thermal noise. Squids are ideally suited to acquiring the very small NMR signals at low magnetic fields and thus allow the use of open geometry magnet systems, which have the potential to offer the patient a more friendly environment during the procedure as well as other benefits described below.

In an NMR or an MRI instrument, the sample or the subject is placed in a magnetic field which results in a polarisation of hydrogen nuclei, with the result that more nuclei point in the direction of the field rather than against it. This polarisation is quite weak for protons in water. It corresponds to parts per million at room temperature at 1 Tesla. To perform NMR, a short radio frequency (RF) pulse at the resonant frequency tips the polarisation to 90° from the field about which the polarisation rotates for a short period at the resonant frequency. It is then detected with suitable RF amplifier electronics. The polarisation decays and reverts back to point in the original direction with a characteristic time constant known as T1. During this period, the energy of the tipped magnetisation is given up to the local environment. That is to say, the nuclear spins are exchanging energy with that local environment. The speed with which energy is exchanged is a measure of the interaction of the nuclei with the local environment.

There is a second way in which the signal decays, which depends on the interaction between the nuclear spins. The so-called spin-spin interaction, in which the spin polarisation becomes spread out. If some atoms/nuclei are in different magnetic fields compared to others, their rotation frequency is slightly different. As the nuclei in different fields rotate at different speeds, the net rotating magnetisation is reduced as different moments start to point in different directions. There is a reducing net magnetic moment. This time constant for interaction between spins is known as T2 if the loss of magnetic moment is due to spin spin interaction or T2* if it is due to poor external magnetic field homogeneity.

It has been found that there are differences in T1 between tissue types and tissue conditions. In particular, it has been discovered that it is possible to detect cancerous tissue by the difference in its T1 time constant. These T1 differences are most pronounced at low magnetic fields well below 100 Gauss.

In conventional nuclear magnetic resonance imaging a strong and highly uniform magnetic field of typically 1 Tesla (10,000 Gauss) or more is used to magnetise the subject and a series of RF pulses is applied to polarise the spins and detect the signal from these. The frequency at which this signal is detected is directly proportional to the local magnetic field. By applying magnetic field gradients to the subject, the signal frequency becomes dependant on position, with spins in higher fields precessing at higher frequencies to those in lower fields. By applying a set of field gradients in all three dimensions, a three-dimensional picture of the subject can be acquired. In practice, gradients across one plane are used to select a planar slice through the subject. This is then analysed by gradients of field in the plane of the slice to produce a two-dimensional picture of the subject in that plane.

The magnitude of the gradient must be sufficient to disperse the spin frequencies by a sufficient amount to allow data to be acquired in the short time available, but not so large as to disperse and depress the detected signal. The background field must be uniform so that variations in the background field do not impinge on the image quality. Typically, figures might be for a 1. Tesla magnet field a gradient of 1000 ppm or 1 Milli T across the subject, requiring a background homogeneity of 2-5 ppm. Building large magnets to accommodate a whole person with a field homogeneity of a few ppm over say a 400 mm sphere is an expensive and difficult task. However, for a system running at lower field, the same field gradients for imaging are required. That is 1 about milli T across the image area, since the same frequency changes are required. This means that the homogeneity of a magnet running at 0.02 Tesla need only be 100 ppm, a figure which is much easier to achieve during magnet construction.

Two methods of using SQUIDs to perform both NMR and MRI have been proposed and demonstrated at low fields. In the first approach, known in the art, for example in the published work of John Clarke of Berkley University USA, the SQUID is used to detect the magnetic moment directly using a DC coupled input coil. The field is typically 0.1 milli Tesla (1 gauss) and frequency 4.2 KHz. In order to get sufficient signal strength it is usual to apply a pre-polarising DC field pulse of about 3000 gauss for a period which must be about T1 or longer to magnetise the subject after which the NMR/MRI pulse sequence and data acquisition can take place.

This procedure has the advantage that the differences in T1 between tissue types and conditions are most favourable at fields of 10 gauss or below. This is illustrated in FIG. 1 which shows the expansion of T1 times at the lowest fields.

The disadvantages of this approach is first the pre-polarising pulse is difficult to apply and secondly the technique is vulnerable to weak DC magnetic field disturbances which distort the image, as well as a susceptibility to RF and AF interference due to the direct DC coupling of the input coil to the SQUID. The technique would therefore normally have to be performed in a shielded room environment.

An alternative technique is to use a resonant superconducting input circuit which is AC coupled to the SQUID input. A frequency of 600 to 800 Kilo Hz and a field of 150 to 200 gauss is used in this procedure. No pre-polarising field is required and the use of a tuned AC coupled input greatly reduces the susceptibility to unwanted interference. This approach has been pioneered by Dr Hugh Seton at Aberdeen University.

However, at this field the T1 times are shorter and less differences in T1are observed between tissue types.

SUMMARY OF THE PRESENT INVENTION

The present invention seeks to provide improved magnetic resonance apparatus and methods as well as a method of detecting tissue abnormalities in a patient or animal.

According to an aspect of the present invention, there is provided an MRI system in which the excitation and the detection of the NMR signal is performed by a resonant input at a median field range above about 100 gauss and where the main field is cycled to a low field of below about 50% of the resonant frequency after the excitation of the NMR signal, for a time period which develops differences in magnetisation (T1).

In an embodiment, there is provided an MRI system in which the detection of the NMR signal is performed by a resonant input at a median field range above 100 gauss and where the main field is cycled after applying a first 90 degree pulse to a low field of well below 100 Gauss and the resonant frequency for a period sufficient to develop differences in magnetisation (T1). The field is then returned to the resonant frequency to allow the NMR signal to be detected and processed.

Preferably, a first RF pulse is applied during a first cycle of the field and a second RF pulse offset from the first is applied in a second cycle, thereby to generate a spin echo of the spins in the field. The first RF pulse may be substantially a 90° (or a substantially) 270° pulse and the second pulse substantially a 180° pulse.

Advantageously, the low field period is between substantially 0.1 to 3 seconds.

In the preferred embodiment, the NMR signal is detected by a SQUID.

According to another aspect of the present invention, there is provided MRI apparatus including first and second coils arranged substantially facing one another, a control system, operable to induce by the a median field range above about 100 gauss and to cycle the field to a low field of below about 50% of the resonant frequency after the first RF pulse for a period which develops differences in magnetisation (T1).

According to another aspect of the present invention, there is provided a method of detecting abnormalities in tissue by means of a system or with apparatus as specified herein:

The preferred embodiment of the present invention uses the resonant frequency SQUID-based MRI method and changes the procedure and pulse sequences so as to have enhanced T1 contrast.

According to another aspect of the present invention, there is provided a magnetic resonance imaging device including first and second superconducting coils, a detection SQUID, and a power unit operable to, power the coils to generate a field of the order of 100 to 1000 gauss, preferably 100 to 300 gauss and most preferably in the region of 150 gauss. The device preferably does not employ an iron core. The field generated by the coils may or may not be pulsed.

BRIEF DESCRIPTION OF THE DRAWINGS

Embodiments of the present invention are described below, by way of example only, with reference to the accompanying drawings, in which:

FIGS. 2A to 2E are schematic diagrams of a preferred embodiment of MRI apparatus from various views;

DESCRIPTION OF THE PREFERRED EMBODIMENTS

Figure 1:
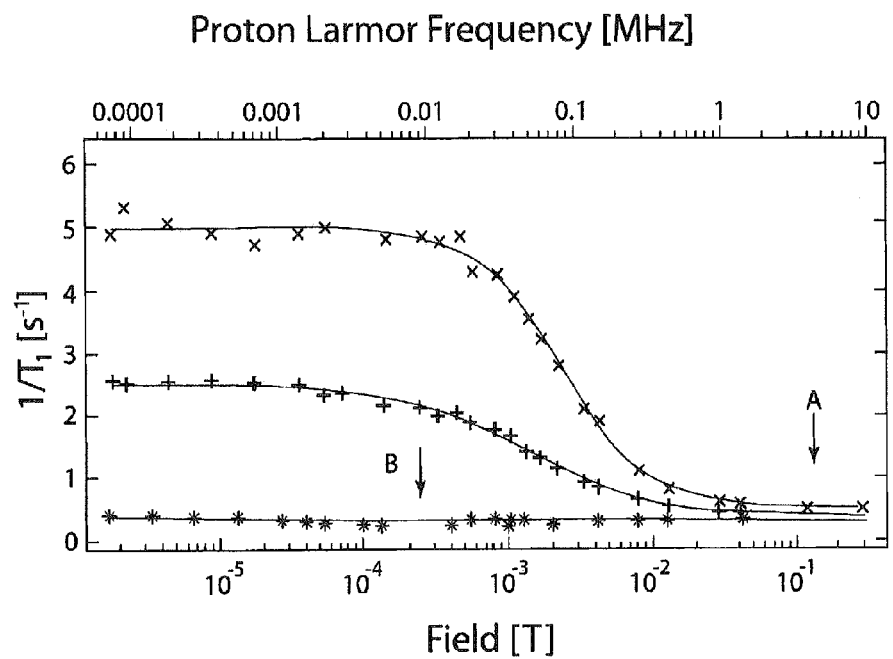
FIG. 1 is a graph showing enhanced T1 results for MRI scanning at lower magnetic fields.
Figure 2A:
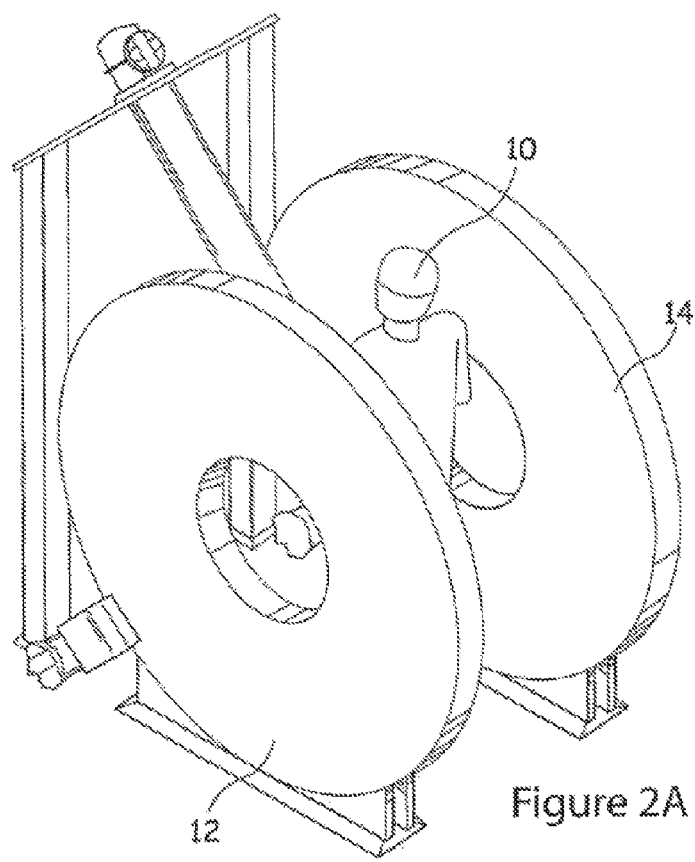
Figure 2B:
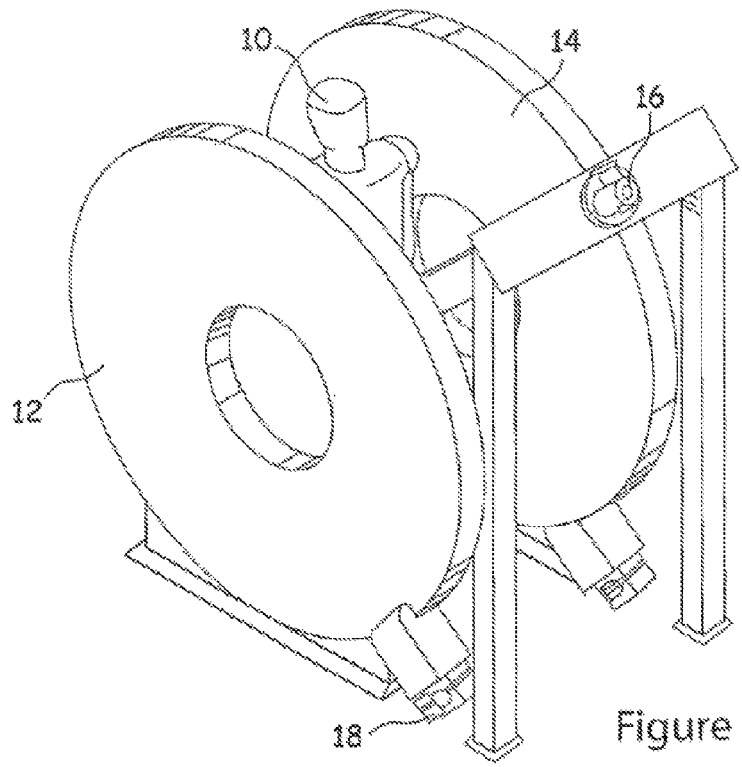

As an example of the preferred procedure, the DC background field is set to, say, 150 gauss and the 90° RF pulse is applied. The background field is then rapidly reduced to about 10 gauss or less and a period of 0.1-3 seconds is allowed to lapse before the 150 gauss field is re-applied and a 180° pulse is applied to generate a spin echo. In this procedure, during the low field period, the differences in T1 between different tissues, or parts of the sample, means that magnetisation will be lost or reduced in some parts of the sample so that the image is altered. Taking two images, one without the field being cycled and one with field cycling and comparing one image to the other will give an image highlighting the variations of T1. It is considered such images provide very good indications of abnormal human or animal tissues, particularly cancer bearing tissues.

One great advantage of SQUID based MRI is that the magnetic fields are modest, which means that the stored energy of the field is small, allowing the field to be switched from one field level to another very quickly. This makes it possible to use the field switching technique described above. For the design proposed, the operating current is about 100 amps and the inductance of the coil set is 100 milli H. A second advantage is that it allows the magnet to be a relatively open structure. Also, the field homogeneity and stability requirements are not so severe, making the magnet technology easier and the design more flexible.

It is to be appreciated that although the preferred embodiment generated a 150 gauss magnetic field as the higher field, it is envisaged that the high field pulses could have of a greater intensity, for instance 300 gauss, 500 gauss and in some instances up to 1000 gauss. However, a system which can rely on a lower field intensity will be smaller, cheaper and require less operational energy.

We now describe a typical embodiment of MRI instrument as it might be realised. FIGS. 2A to 2F show a subject/patient 10 between two planar annular magnets 12, 14, with the SQUID detector in its own cryostat 16 placed close to the patient. It can be readily seen that the magnets 12, 14 are of a size and position that they allow space for the subject 10 to sit, lie or stand between them. As the field is both low and switchable, it is also possible to consider manipulations and surgical operations to be performed without moving the patient 10 from the scanner. Thus, the physician can monitor the progress of a medical procedure using live scan results, which can provide significant clinical benefits.

Both of the planar magnets 12, 14 are preferably energised by the same current source. They provide a highly uniform field of up to 200 gauss at the central position with better than 100 ppm homogeneity over at least 200 and preferably more than a 250 mm sphere. The planar windings (not visible in the Figures but of a type which will be evident to the skilled person) are cooled in a vacuum insulated cryostat which has either liquid cryogens or, preferably, a cryo-cooler 18 to maintain the windings in the superconducting state. About 4K is required for windings of NbTi but higher temperatures would be acceptable for advanced HTS conductors. The cryostats and coil sets are designed to have a low Johnson noise contribution from any metal parts.

The tuned pick-up detection coils (not visible in the Figures but of a type which will be evident to the skilled person) and the SQUID are placed within a third cryostat. This cryostat is also designed to have a very low Johnson signal. Techniques for this are known in the art and for example described in the published works of Hugh Seton of Aberdeen University. The pick-up coil may be designed as a single turn or as an astatic reverse pair to increase the selectivity to signals close to the pick-up circuit, that is the subject 10. It is also possible to use an array of detector coils, each connected to a SQUID, as a set of parallel inputs to be amplified, detected and analysed. Since the input circuit is tuned to operate in the resonant NMR frequency range of 100 KHz or more, the input coil is AC coupled to the SQUID. Low frequency, for example 50 Hz mains, and quasi DC signals from changes in the background field are not transmitted to the SQUID which would otherwise be saturated with unwanted signals. Care should be taken with the design of the gradient coils to minimise the interaction with the SQUID detection circuit, a task within the abilities of the skilled person.

The NMR signal detected and amplified by the SQUID circuit is digitised and analysed by a conventional MRI console which will usually be controlled from a computer 22, which is also used to display the resultant images.

Figure 3:
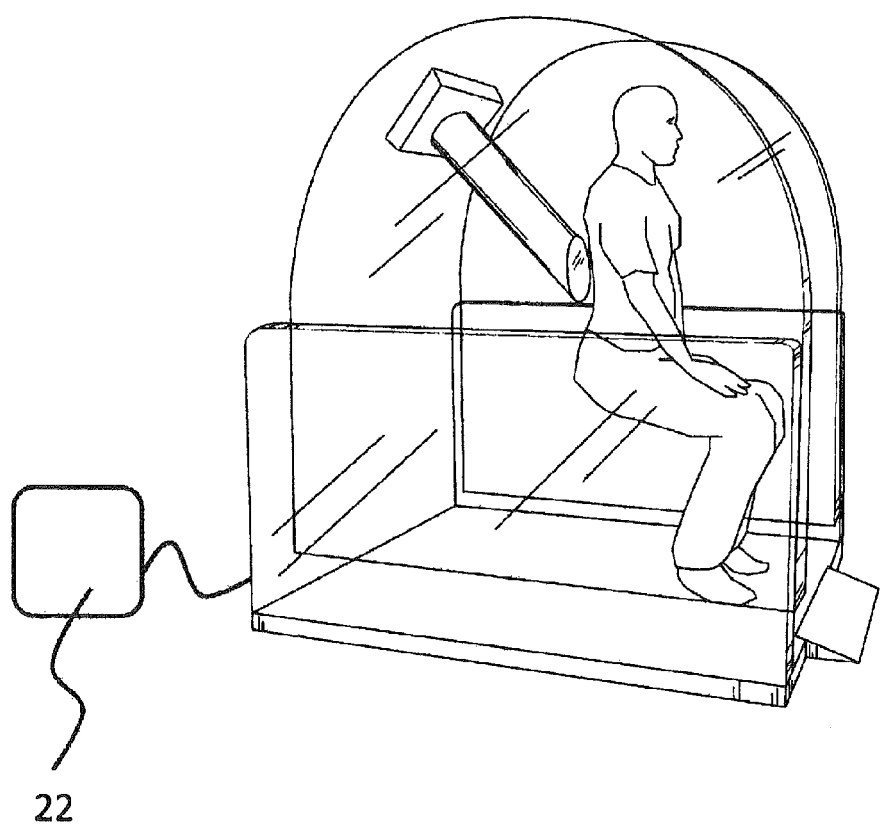
FIG. 3 is a side elevational view of another embodiment of MRI apparatus.

FIG. 3 is a side elevational view of another embodiment of MRI apparatus, viewed as a possible practical implementation of the device. It can be seen that there is provided an area within the MRI system for a patient to sit comfortably and in which the patient is not enclosed within the device, as occurs with prior art systems.

Figure 4:
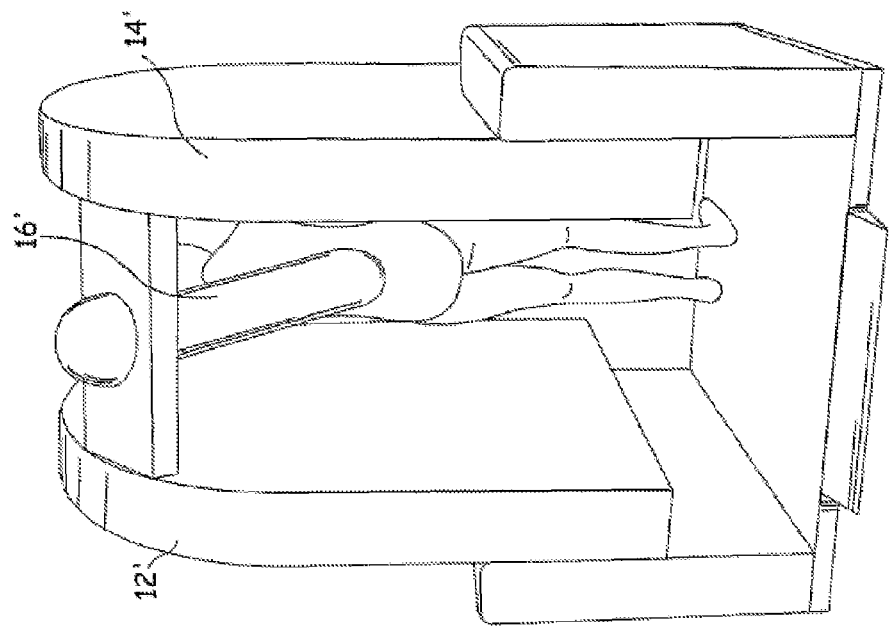
FIG. 4 shows a series of views in schematic form, of a practical implantation of MRI apparatus similar to that of FIGS. 2A to 2F.
Figure 4:
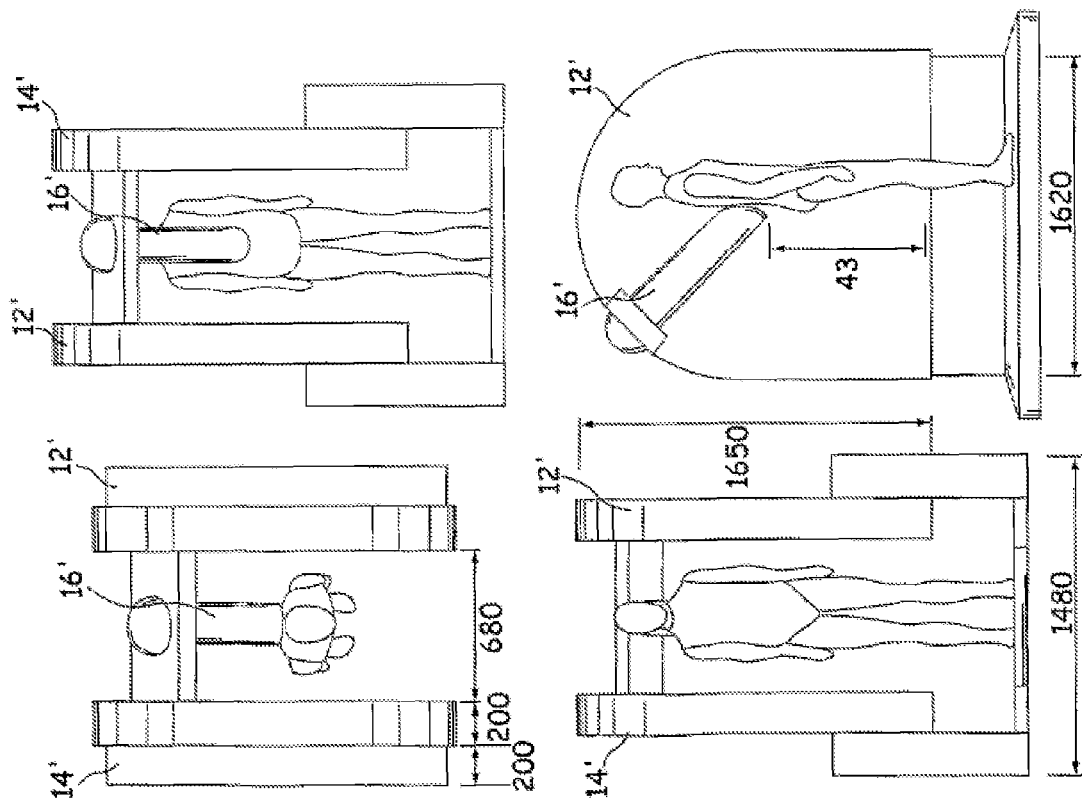

Referring now to FIG. 4 there is shown another practical implementation of the device, which in the views of FIG. 4, allows a patient to be scanned while in a standing position and within apparatus which is substantially open and thus less daunting to the patient compared with prior art scanning devices. A further advantage of a standing position is that for scans of patients with back pane and spinal problems it is very useful to observe the spine under load in the standing position. This will be quite different from an image taken with the patient lying down. It can be seen that the coils 12' and 14' are housed within the suitable chambers to provide an oligomeric and aesthetically pleasing structure.

Figure 5:
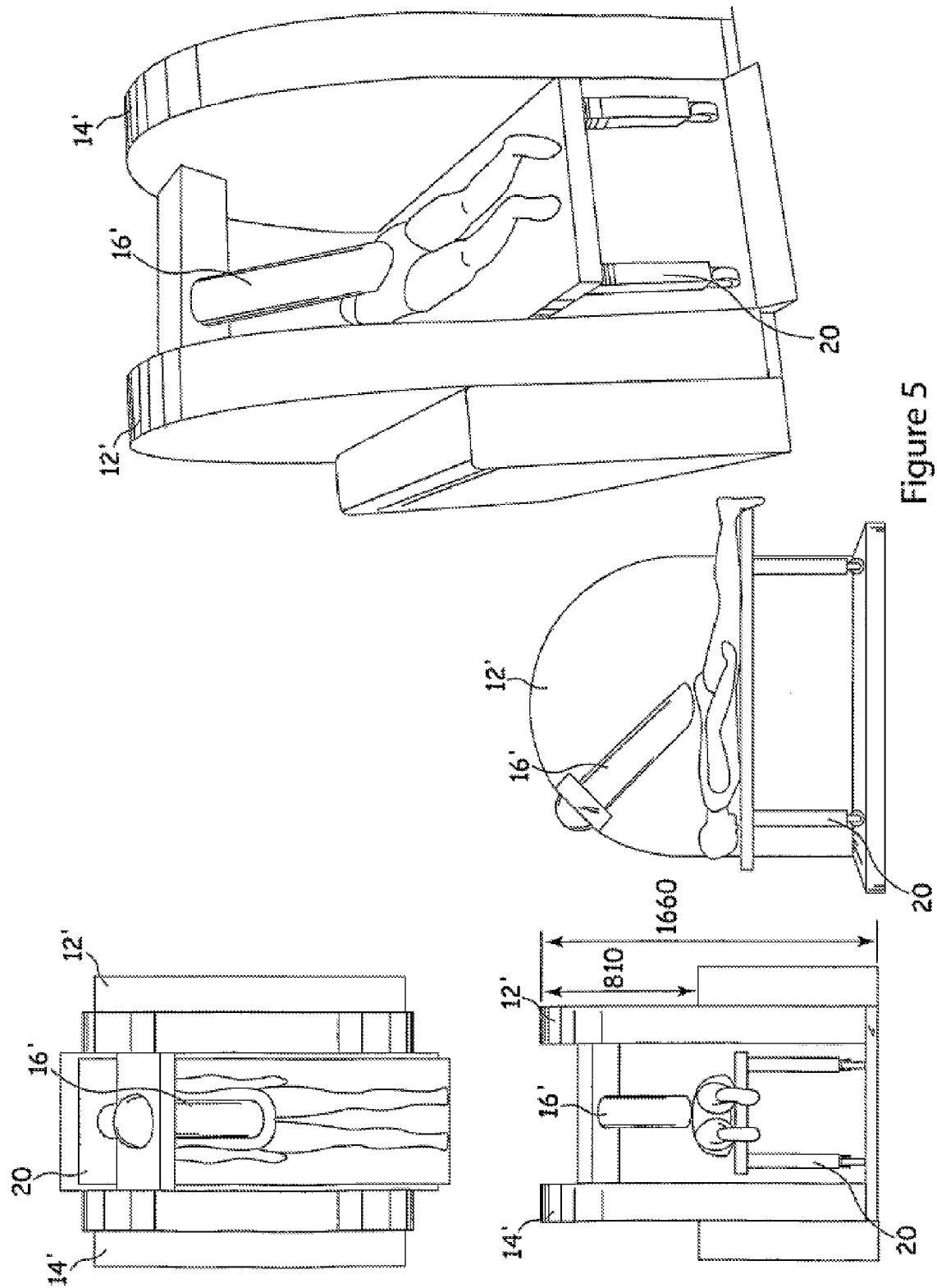
FIG. 5 shows a series of views, in schematic form, of the implantation of MRI apparatus of FIG. 4 with a patient resting on a bed or platform.
Figure 6:
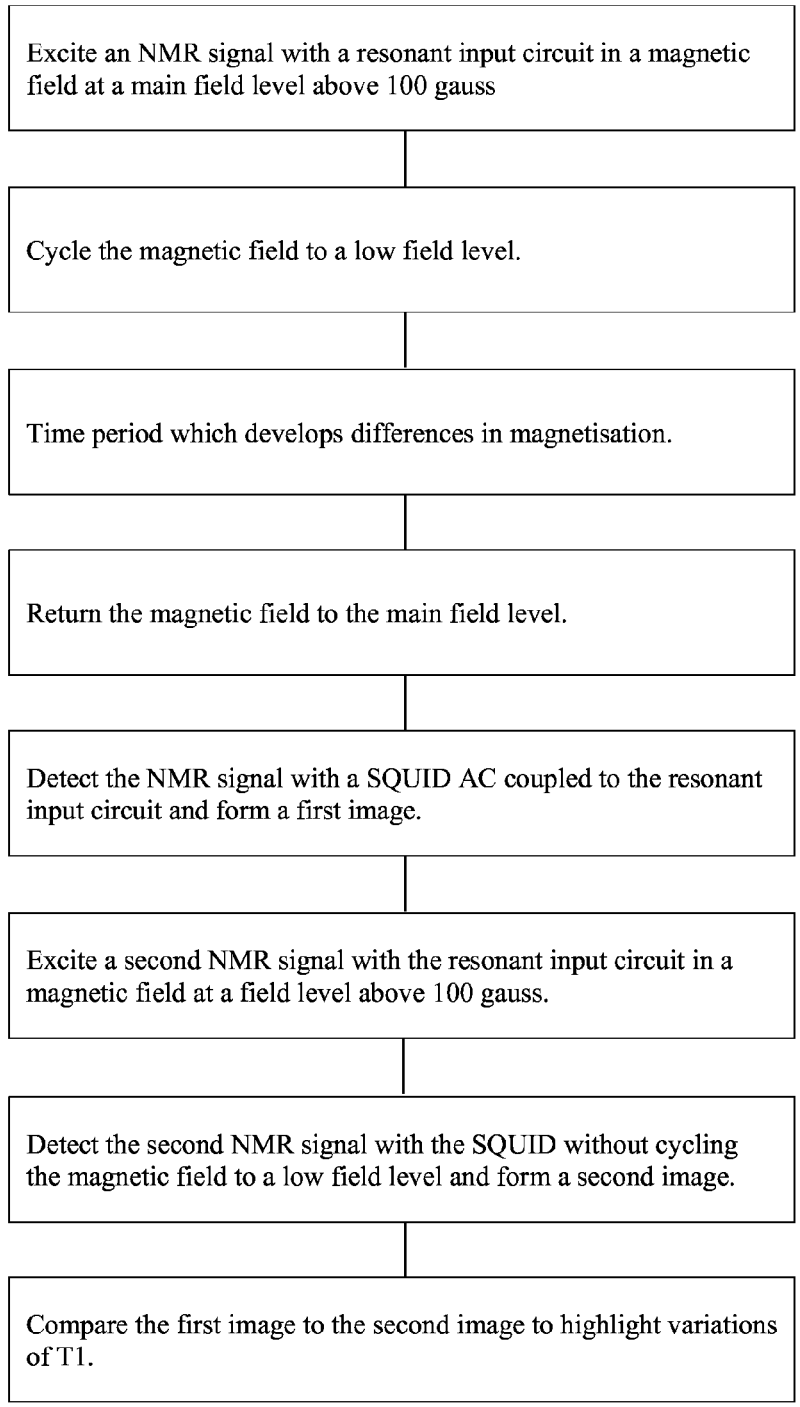
FIG. 6 shows a method of Magnetic Resonance Imaging (MRI) detection according to embodiments of the present disclosure.

The views of FIG. 5 show the apparatus of FIG. 4 when arranged for a patient lying on a bed or platform 20, in which case the cryostat probe 16' can be oriented to accommodate the patient in a lying position. Again, even when on a bed or platform, the patient is kept in a relatively open environment and one in which, as a result of the manner of operation of the device, does not generate excessive noise or other disturbance during operation of the system which could unsettle the patient.

In summary, there is proposed herein a method and system for producing a much lower MRI field than existing devices and in which by a temporary significant reduction in the field and subsequent generation of a spin echo it is possible to generate different images of a subject which are able to detect abnormalities in tissue, particularly cancerous and non-cancerous tissues. It is envisaged that this method and system could also detect other tissue abnormalities or anomalies.

It will also be apparent that the low field is preferably much less than 50% of the main field intensity and in the preferred embodiments in the region or 10% or so.

The embodiments described above are directed to a scanner into which a person can fit substantially entirely. It is envisaged that many practical implementations of the system and apparatus disclosed herein could be significantly smaller and designed, for instance, to scan and image only a portion of a patient. Systems could be provided, for instance, for breast cancer screening, liver screening, in the diagnosis of back pain and so on. In such applications, the device could be physically smaller and may, for instance have coils no more than around 700 to 800 millimetres in diameter and even smaller. Such systems would preferably include a superconducting coil set able to generate an intense field of the order of 100 to 500 gauss, preferably, and with a SQUID based detector. The apparatus would have no iron core and may or may not provide for field pulsing of the type disclosed above.

The invention claimed is:

1. A Magnetic Resonance Imaging (MRI) apparatus including first and second coils arranged substantially facing one another, a resonant input circuit configured to excite a nuclear magnetic resonance (NMR) signal, a control system configured to induce by the coils a magnetic field at a main field level of 100 to 1000 gauss and to cycle the field to a low field level of below 50% of the main field level after the excitation of the NMR signal, for a time period which develops differences in magnetisation, and, after the time period which develops differences in magnetisation, to return the magnetic field to the main field level to allow the NMR signal to be detected, and a Superconducting Quantum Interference Device (SQUID) coupled to the resonant input circuit for detecting the generated NMR signal.

2. The MRI apparatus according to claim 1, wherein the main field level is 150 gauss.

3. The MRI apparatus according to claim 1, wherein the low field time period is between 0.1 to 3 seconds.

4. The MRI apparatus according to claim 1, wherein the first and second coils are a split pair of superconductive coils or superconductive planar windings for generating the magnetic field.

5. The MRI apparatus according to claim 4, wherein the first and second coils are enclosed in a low Johnson noise cryostat made from non-metallic materials.

6. The MRI apparatus according to claim 4, wherein the first and second coils are cryo-cooled.

7. The MRI apparatus according to claim 1, wherein the apparatus has at least one open side.

8. The MRI apparatus according to claim 1, wherein the control system is operable to apply a first radio frequency (RF) pulse during a first cycle of the main field level and a second RF pulse during a second cycle of the main field level, thereby to generate a spin echo in particles in the field.

9. A method of Magnetic Resonance Imaging (MRI), comprising the steps of:

exciting a nuclear magnetic resonance (NMR) signal with a resonant input circuit in a magnetic field at a main field level of 100 to 1000 gauss;

cycling the magnetic field to a low field level of below 50% of the main field level after excitation of the NMR signal, for a time period which develops difference in magnetisation;

after the time period which develops differences in magnetisation, returning the magnetic field to the main field level and detecting the NMR signal; wherein the NMR signal is detected by a Superconducting Quantum Interference Device (SQUID) coupled to the resonant input circuit.

10. The MRI method according to claim 9, wherein the main field level is 150 gauss.

11. The MRI method according to claim 9, wherein the time period of the low field level is less than 10 seconds.

12. The MRI method according to claim 11, wherein the time period of the low field level is between 0.1 to 3 seconds.

13. The MRI method according to claim 9, wherein the magnetic field at the low field has an intensity of 10% of the magnetic field level.

14. The MRI method according to claim 9, wherein-the magnetic field is generated by a split pair of superconducting coils or superconducting planar windings.

15. A method according to claim 9, wherein a first radio frequency (RF) pulse is applied during a first cycle of the main field level and a second RF pulse is applied during a second cycle of the main field level, thereby to generate a spin echo of the magnetisation in the magnetic field.

16. A method according to claim 9, further comprising the steps of:

forming a first image from the NMR signal;

exciting a second NMR signal with the resonant input circuit in the magnetic field at a main field level of 100 to 1000 gauss;

detecting the second NMR signal with the SQUID without cycling the magnetic field to a low field level;

forming a second image from the second NMR signal;

comparing the first image to the second image to highlight variations of T1.

* * * * *